(12) United States Patent
Machado

(10) Patent No.: US 7,940,128 B2
(45) Date of Patent: May 10, 2011

(54) HIGH SPEED PLL CLOCK MULTIPLIER

(75) Inventor: Joaquim J. Machado, Espinho (PT)

(73) Assignee: Synopsys, Inc., Mountain View, CA (US)

( * ) Notice: Subject to any disclaimer, the term of this patent is extended or adjusted under 35 U.S.C. 154(b) by 232 days.

(21) Appl. No.: 12/211,786

(22) Filed: Sep. 16, 2008

(65) Prior Publication Data

US 2009/0284318 A1    Nov. 19, 2009

Related U.S. Application Data

(60) Provisional application No. 60/973,152, filed on Sep. 17, 2007.

(51) Int. Cl.
*H03L 7/00* (2006.01)

(52) U.S. Cl. ............. 331/16; 331/34; 331/1 A; 327/156; 327/159; 375/376

(58) Field of Classification Search .................... 331/16, 331/34, 179, 177 R; 327/156; 375/376
See application file for complete search history.

(56) References Cited

U.S. PATENT DOCUMENTS

| | | | |
|---|---|---|---|
| 4,980,652 A | 12/1990 | Tarusawa et al. | |
| 5,811,998 A | 9/1998 | Lundberg et al. | |
| 5,982,936 A * | 11/1999 | Tucker et al. | 382/233 |
| 7,495,517 B1 * | 2/2009 | Hoang et al. | 331/16 |
| 7,519,140 B2 * | 4/2009 | Yoshimura | 375/376 |
| 2002/0154723 A1 | 10/2002 | Nakamura | |
| 2003/0231729 A1 | 12/2003 | Chien et al. | |

* cited by examiner

*Primary Examiner* — Arnold Kinkead
(74) *Attorney, Agent, or Firm* — Bever, Hoffman & Harms, LLP; Jeanette S. Harms

(57) ABSTRACT

The present invention relates to a mixed mode electronic circuit that implements a PLL cell that employs an auto-range algorithm to lock to a wide range of input reference signals.

13 Claims, 9 Drawing Sheets

HIGH SPEED PLL CLOCK MULTIPLIER

CROSS-REFERENCES TO RELATED APPLICATIONS

This application claims priority under 35 U.S.C. 119(e) to commonly owned U.S. Provisional Patent Application No. 60/973,152, entitled "HIGH SPEED PLL CLOCK MULTIPLIER", filed on Sep. 17, 2007, the disclosure of which is incorporated herein by reference in its entirety.

BACKGROUND OF THE INVENTION

The present invention relates to a phase-locked loop for an electronic circuit and more particularly a high speed PLL clock multiplier.

A phase-locked loop (PLL) is an electronic feedback system that generates a signal, the phase of which is locked to the phase of an input or "reference" signal. This is accomplished in a common negative feedback configuration by comparing the output of a voltage controlled oscillator or divider to the input reference signal using a phase and frequency detector. The phase detector output is then used to drive the phase of the oscillator towards that of the input reference signal. Since a single integrated circuit can provide a complete phase-lock-loop building block, the technique is widely used in a variety of electronic applications. Output frequencies range from a fraction of a cycle per second up to many gigahertz.

A problem arises when the PLL must be capable of accepting an input reference signal that can vary widely. What is needed is a stable PLL circuit that can be adapt to a wide range of input reference signals.

DETAILED DESCRIPTION OF THE INVENTION

The present invention relates to a mixed mode electronic circuit that includes both analog and digital components to implement a PLL cell 10 that is preferably implemented in CMOS semiconductor technology. By employing an auto-range algorithm, PLL 10 is able to lock to a wide range of input reference signals whereby, by way of illustration, input reference frequencies may range from about 22.5 MHz to about 148.5 MHz.

Figure 1A:
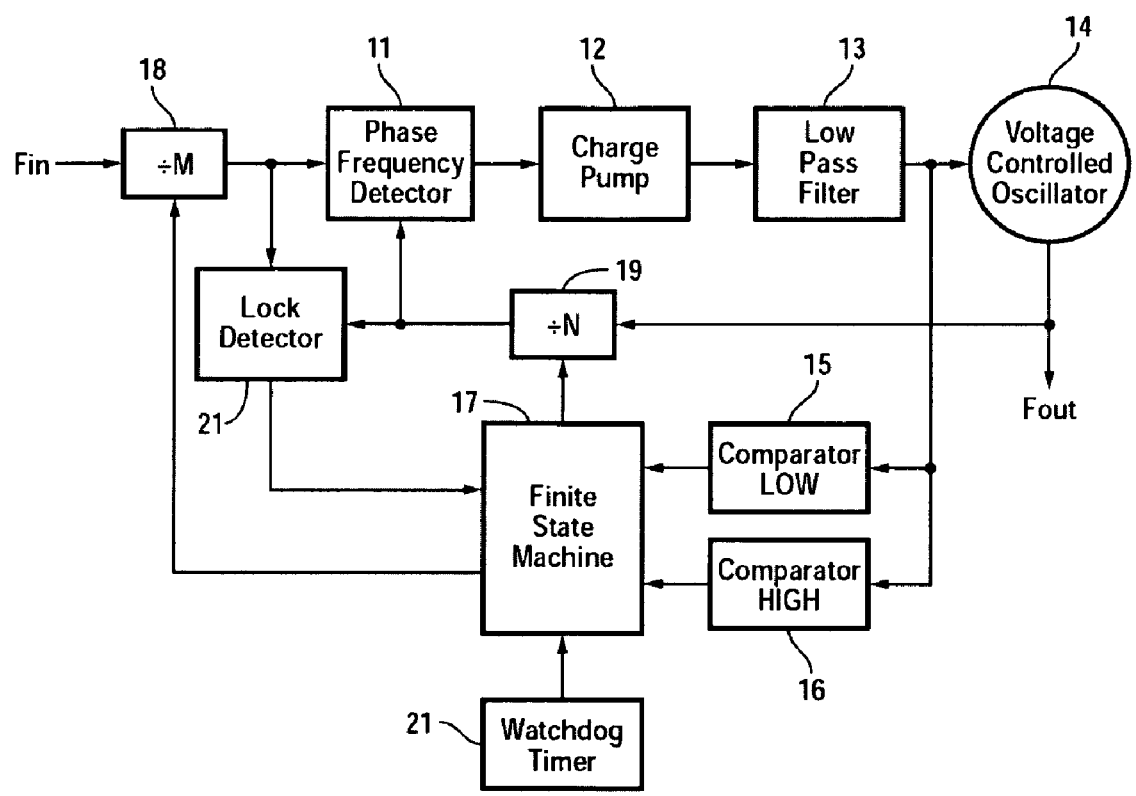
FIGS. 1A and 1B each illustrate a block diagram of an embodiment of the present invention.
Figure 1B:
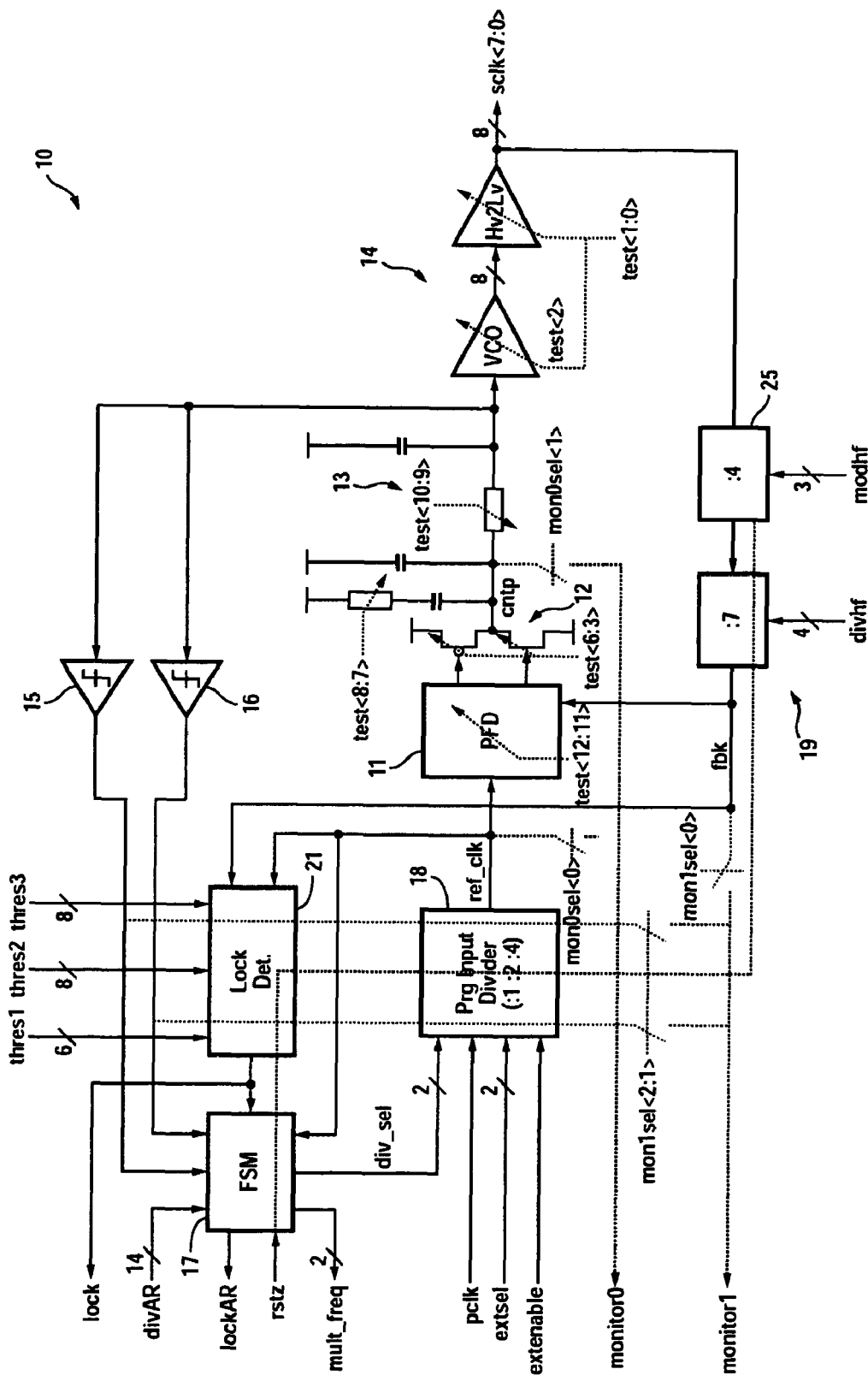

Referring now to FIGS. 1A and 1B, the present invention is illustrated as having a plurality of analog components including a phase frequency detector (PFD) 11 coupled to a charge pump 12 which is coupled, in turn, to a low pass filter 13. The output of the filter is coupled to a voltage controlled oscillator (VCO) 14.

In one embodiment, PFD 11 has a frequency of operation that ranges from about 20 to 40 MHz and adjustable clear delay to eliminate or minimize the dead zone when a reset occurs. Charge pump has a frequency of operation that ranges from about 20 to 40 MHz and linearity better than ±5%. It will be appreciated that different operating frequencies or linearity may be employed in other embodiments. VCO 14 comprises a four cell differential ring oscillator oscillating from 550 to 1100 MHz (or at a frequency of 500 MHz if cntp=avdd). Since the VCO operates from 550 to 1100 MHz the output clock, Fout, will, in one embodiment, be 7, 14 and 28 times larger than the reference frequency. Again, it will be appreciated that different operating frequencies or multiplication factors may be employed in other embodiments.

The output of the filter 13 is also coupled to a pair of threshold comparators, CMPL 15 and CMPH 16, which tightly follow the VCO characteristics for process corners. CMPL 15 and CMPH 16 share the same geometries and are preferably positioned proximate to the VCO when instantiated in silicon. More specifically, CMPL 15 is a VCO control voltage comparator that indicates a desired lower frequency operating state to a digital component, such as auto-range FSM 17. If VCO 14 control voltage (cntp) output is in the normal operating region, the output of CMPL 15 will be equal to "1", a logic high. If the cntp voltage is too low (that is, closer to analog ground) the output of CMPL 15 will be equal to "0", a logic low. CMPH 16 is also a VCO control voltage comparator, however, it represents the higher frequency operating state to auto-range FSM 17. If VCO 14 control voltage (cntp) output is in the normal operating region, CMPH will be equal to "0" a logic low. If cntp voltage is too high, CMPH will be equal to "1", a logic high. This information will be given to the digital part of PLL 10 and used with an oversampling algorithm to achieve a stable PLL circuit that can be adapt to a wide range of input reference signals.

FSM 17 controls dividers 18 and 19 and operates based on values associated with the outputs from the other digital components and the output of the analog threshold comparators. The other digital components include an input frequency divider 18, a loop divider 19, a watchdog counter 20, a digital lock detector 21. Input divider 18 accepts a reference clock signal that may vary between, for example, 25 MHz to 400 MHz. In order to maintain the VCO in its linear region, the two threshold comparators CMPL 15 and CMPH 16 provide the FSM (Finite State Machine) with the lower and higher operational bounds of the VCO.

Input divider 18 may divide the reference clock signal or not, depending on the required output operating range of the PLL. In the Table 1 example, the different division ratios that input divider 18 can operate are illustrated.

TABLE 1

| Input Divider | VCO output | Input Clock | Desired output frequency | Oversampling |
|---|---|---|---|---|
| 1 | 800 MHz to 400 MHz | 50 MHz to 25 MHz | 100 MHz to 50 MHz | 8x |
| 2 | 800 MHz to 400 MHz | 100 MHz to 50 MHz | 200 MHz to 100 MHz | 4x |
| 4 | 800 MHz to 400 MHz | 200 MHz to 100 MHz | 400 MHz to 200 MHz | 2x |
| 8 | 800 MHz to 400 MHz | 400 MHz to 200 MHz | 800 MHz to 400 MHz | 1x |

In one embodiment, input frequency divider 18 has a division factor, M=1/2/4/8, and frequency ranges from 25 to 340 MHz. The division factor is controlled by FSM 17, however, for testability purposes, external override of selected division is allowed.

The high frequency loop divider 19 provides a feedback reference of the PLL reference output. Loop divider 19 has an adjustable division factor, N, and can divide the VCO frequency by, for example, 20/25/30/40 or 50. The actual division factor for a specific embodiment is application specific and is typically an engineering selection. Loop divider 19, in the embodiment illustrated in FIG. 1B, is implemented with a high frequency constant divide by 28 (N*P=7*4) circuit having a prescaler stage 25 that allows for faster operation. It will be recognized that the prescaler stage will result in missing division ratios. However, implementing loop divider 19 in two stages advantageously allows the output of a "rated PCLK" between stages. For "rated pclk", in one embodiment, multiple ratios are preferably implemented to support a maximum number of operating modes.

PFD 11 uses the output of input frequency divider 18 as a reference frequency to detect phase or frequency deviations from the feedback reference of the PLL 10 generated by loop divider 19. Charge pump 12 is responsible for sourcing or sinking a constant current directly dependent on the output of PFD 11. Low pass filter 13 integrates the constant current to generate a filtered proportional voltage output that in turn is applied to VCO 14. The output of VCO 14 is applied to loop divider 19 the output of which is applied to PFD 11, as previously noted, and lock detector 21. The value of loop divider 19, divided by the maximum input division ratio (or factor) provides the multiplication factor of the PLL 10. Since the input reference frequencies may range from 22.5 MHz to 148.5 MHz, in one embodiment, the main PLL function is frequency locked by a multiplication factor of seven.

Figure 2:
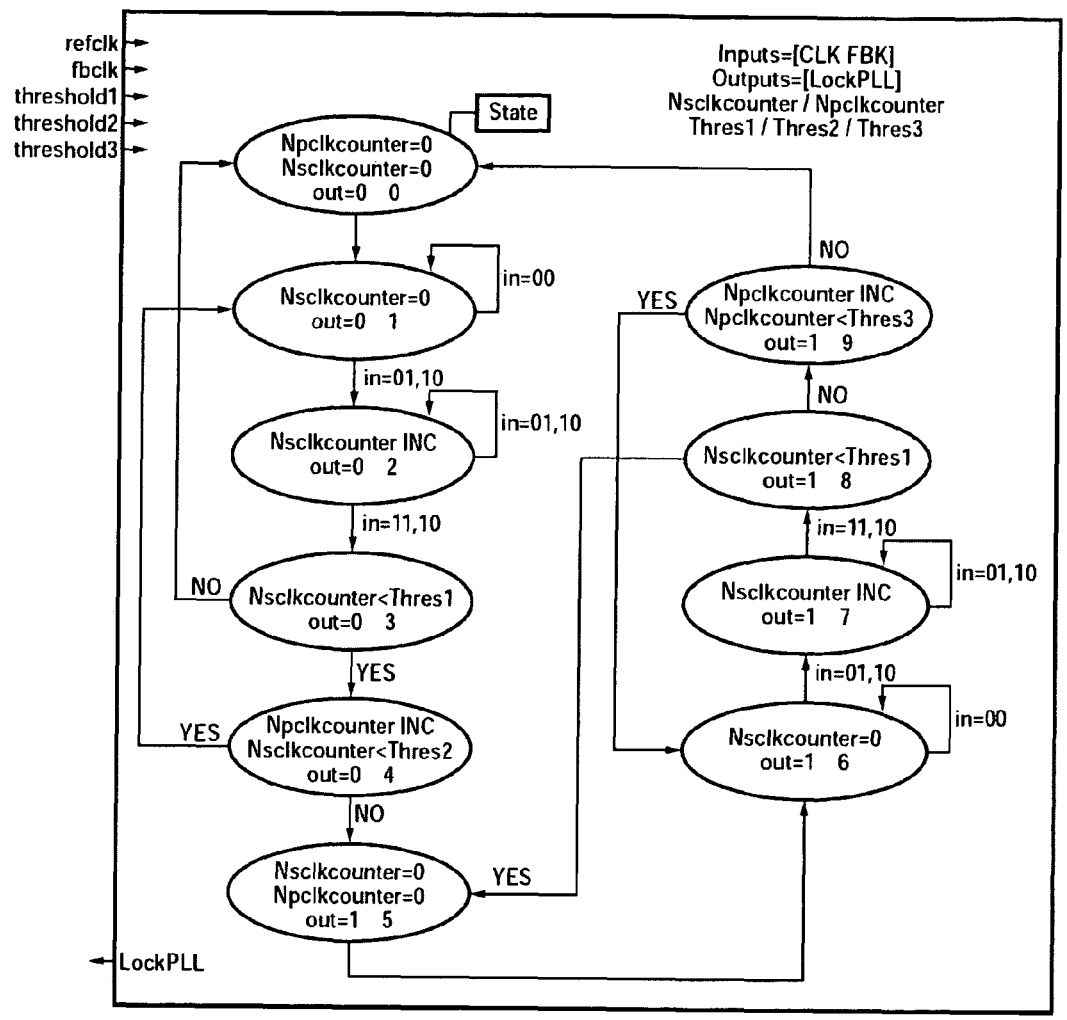
FIG. 2 is a state diagram illustrating a lock and unlock detection algorithm in accordance with an embodiment of the present invention.

FIG. 2 illustrates the state diagram for lock detector 19. Lock detector 19 decides when the PLL is locked to a reference frequency. This detector is completely digital and it possesses two counters, Nsclkcounter and Npclkcounter, that operate as illustrated in FIG. 2. The first counter will be clocked by the VCO frequency and counts the distance between the reference clock (the output of the input divider) and the feedback clock edges (as generated by the output of the loop divider). The second counter is clocked with the first counter's result after a comparison with a given threshold (Thres1). The second counter will be reset if first counter overflows threshold 1 (Thres1) before second counter reaches threshold 2 (Thres2). If second counter reaches Thres2, we declare the PLL as locked since it has been at Thres2 times, less than Thres1 delay. These thresholds are fully programmable and provide extra flexibility for various circuit implementations and embodiments.

After lock condition is acquired, we apply the same principle for unlock condition as indicated on the right side of FIG. 2. However the second counter will now have a threshold 3 (Thres3), that will be quite inferior to Thres2, because it is undesirable to wait a large number of CLK periods before declaring that a PLL unlock has occurred. For example, an unlock condition preferably occurs within two or three clock periods although a lock may take, for example, 64 clock periods or more. The thresholds for this block; thres1, thres2 and thres3, need not be fixed and can be externally adjusted using test mode registers (see FIG. 1B). In one embodiment, the first counter and second counter have 5-bit and 8-bit length respectively. As used herein, the phrase "unlock condition" means that the reference clock and the feedback clock are out of phase for a selected amount of time, such as may occur during reset or other change of input clock frequency.

FSM 17 determines the PLL operating range using the information provided by analog comparators (CMPL 15 and CMPH 16), digital lock detector 21 and watchdog counter 20, which in one embodiment comprises a 14-bit counter that defines number of Feedback cycles that the FSM will wait in order to allow loop to stabilize before taking any decision. By way of illustration the default value for the watchdog counter 20 is 512 in one embodiment. Note that it is that the counter is active low in one preferred embodiment.

Figure 3A:
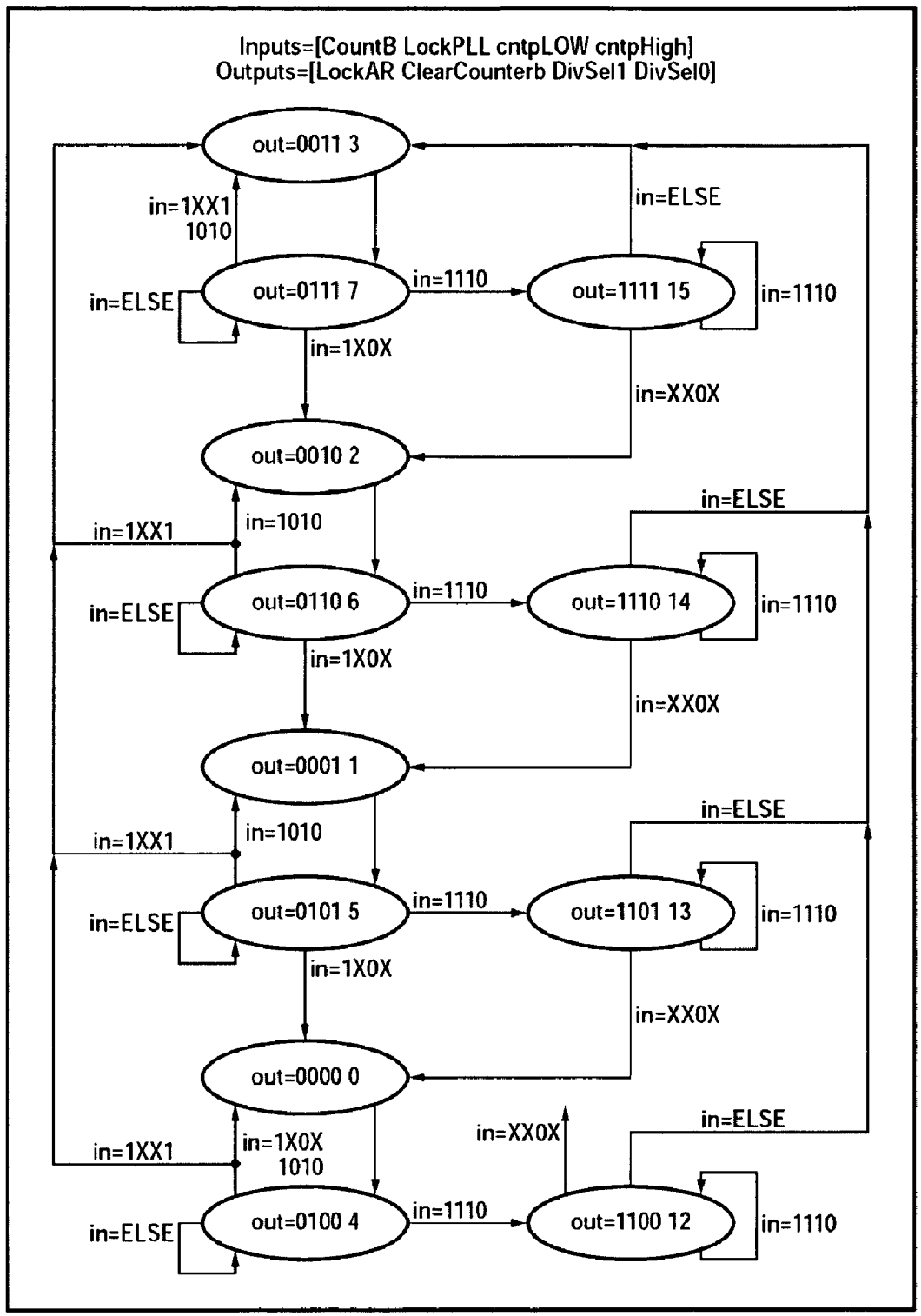
FIGS. 3A and 3B are state diagrams illustrating an auto ranging state algorithm for an embodiment of the present invention.
Figure 3B:
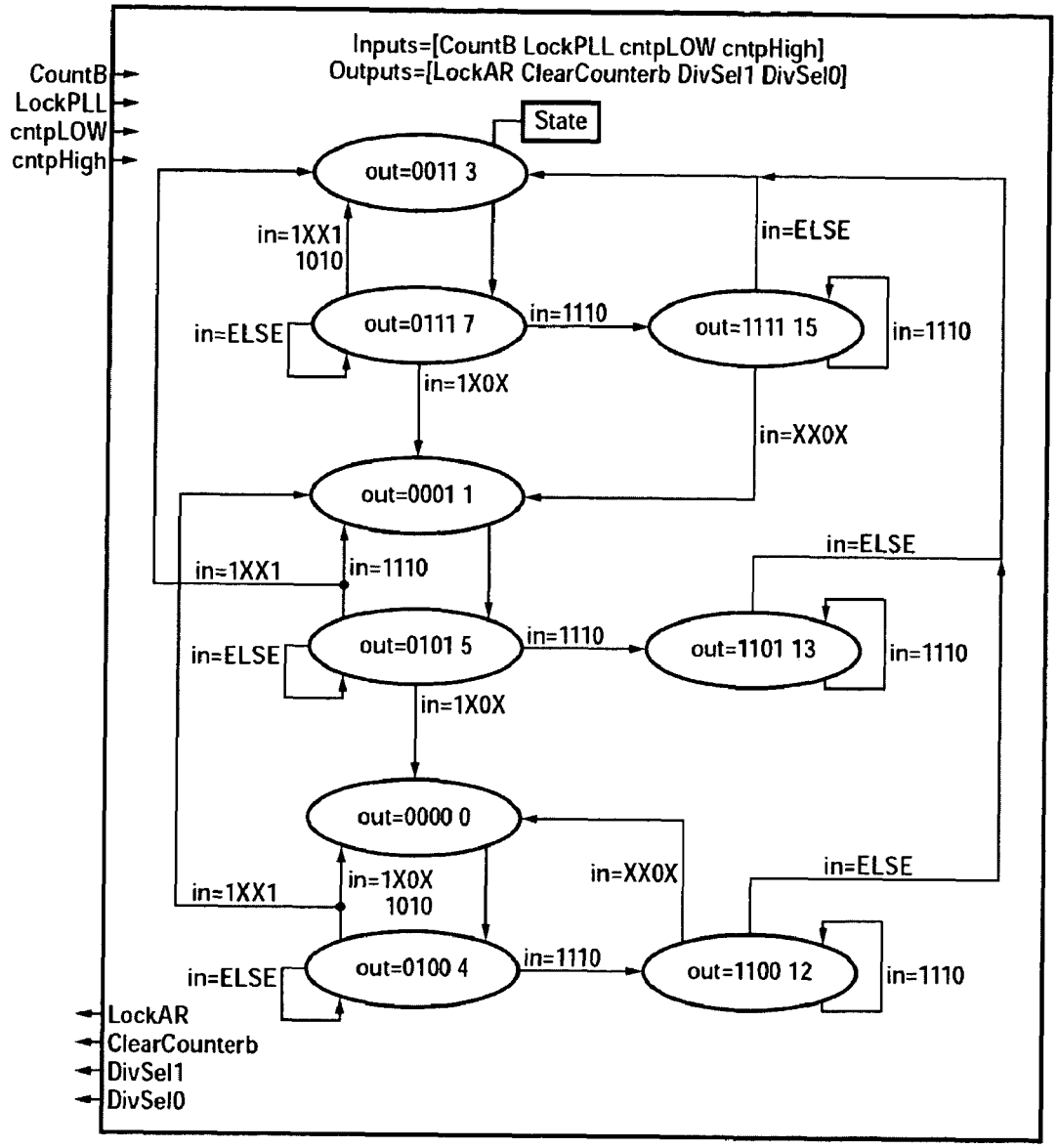

Refer now to FIGS. 3a and 3B. In a reset or startup condition (see, state 12 in either FIG. 3a or FIG. 3b), the PLL starts with input clock divided by one and a clear counter value set to zero. Depending on the configuration, a first state of FSM 17 is decided, that being whether the input clock should be divided either by 8, 4 or 2. In some applications with a plurality of input conditions, the PLL can start at any of the aforementioned states. In other embodiments where there is only one input condition, the input clock divider starts at its maximum dividing value. This avoids division by an invalid ratio for the plurality of input conditions.

FSM 17, then waits for the watchdog timer 20 to react to the defined threshold, which is not fixed and which, preferably, is externally defined. Watchdog timer 20 ensures that FSM 17 will allow sufficient time for the PLL loop to react to the first state. Note that the watchdog counter must be accurately defined or set to guarantee that the loop will be stable when PLL 10 is expected to be stable and decisions can be taken. If the watchdog counter threshold is reached and if the PLL 10 is not locked, as indicated by lock detector 21, or if the state of analog comparators 15 and 16 are not within the expected respective range, FSM 17 will react accordingly as indicated below:

If Watchdog counter is finished, if CMPL=0 then the required VCO frequency is too low, Input clock is too low, FSM then reduces input division ratio to increase frequency and restart watchdog counting;

If Watchdog counter is finished, if CMPH=1 then frequency is to high and FSM starts from first state, probably input clock is in an invalid range;

If Watchdog counter is finished, if CMPL=1, CMPH=0 and Lock detector=0, then PLL is still not locked and the FSM restarts the same procedure because the PLL is not stable when it was expected to be stable;

if Watchdog counter is finished and if analog comparators indicate a stable region has been achieved and the lock detector indicates that the PLL is locked then FSM indicates that an Auto Range Lock has been achieved; and for any other input combination, the FSM remains unchanged in the same state.

In FSM auto-range lock condition, the PLL restarts the locking procedure if the inputs change to any value other than 1110 (watchdog countb_ok, lockpll_ok, CMPL_ok, CMPH_ok). In alternative embodiments, the paths between state 15 and state 2, between state 14 and state 1, between state 13 and state 0 and between state 12 and state 0 are removed. This may be done in order to guarantee that the PLL completely recovers in the event of a loss or change of input clock frequency.

The same outlined behavior applies for division ratios of 4, 2 and 1 until the FSM reaches lock with a correct division ratio. Anytime CMPH equals 1, the FSM goes back to the start state (depending on the configuration) and restarts the procedure. If the FSM does not indicate a lock condition after going through all the states, the input range (or the input clock) is invalid according to the specification and the lock algorithm is restarting until a valid condition is met.

Similarly, as indicated in the algorithm illustrated in FIG. 3B, the paths between state 15 and state 1, between state 13 and state 0, and between state 12 and state 0 are removed compared to the algorithm shown in FIG. 3A. Again this is done to guarantee that the PLL completely recovers in the event of a loss or change of input clock frequency. It is to be understood that the algorithm shown in FIG. 3B corresponds to a FSM that covers a smaller range of input frequencies and over-sampling factors. FIGS. 3A and 3B then resume the above auto range sequence.

The present invention allows for external definition of the watchdog counter threshold. As illustrated in FIG. 1B, the present invention also allows for the complete bypass of the FSM to enable manual control over the division ratio of the input divider.

The threshold CMPH and CMPL compare the filtered proportional voltage to internally generated reference voltages that represent the VCO process dependent metrics and guarantee, for a selected process, the minimum VCO operating range that is dictated by the PLL input range and the number of oversampling steps. Preferably, the VCO range is minimized while still maintaining the desired output frequency by a factor equal to the amount of oversampling. This provides stable operating conditions and easier design over a wide range of process parameters.

In one embodiment, the PLL is designed for a 65 nm LP CMOS technology. It uses a VCO made as a four cell differential ring oscillator oscillating from 450 to 850 MHz where one cell comprises a small delay buffer. In this manner, the period of oscillation will be equal to four times the delay of each buffer. An auto-range algorithm enables the PLL to lock with reference frequencies ranging from 25 MHz to 340 MHz, by way of example. The output frequency from the VCO is fed back and compared to the divided input reference frequency by means of a three-state phase-frequency detector (PFD) with no dead-zone. The digital PFD commands the charge-pump, which in turn delivers/extracts charge to/from the loop filter.

The integrated loop filter is a second order low-pass filter with a pole at the origin and pole-zero compensation to stabilize the phase-locked loop. The differential VCO architecture together with a large loop bandwidth of the low-pass filter ensures that the internal PLL phase noise is small.

The lock detector and specific test features ease the integration of the PLL in a complex circuit. Lock detector registers are preferably configured with an initial default value to set the threshold values. By way of illustration, in one embodiment, thres1 is a 6-bit value having a default value of 8 which is typically sufficient to indicate the allowed maximum PLL phase tracking error, thres2 is an 8-bit value having an initial value of 64, which indicates the required number of Fbk cycles to confirm lock, and thres3 is a 4-bit value having an initial value of 4, which indicates the maximum number of Fbk cycles to confirm an unlock condition. In other embodiments, the various thresholds will have different bit lengths and initial values than indicated above for the illustrative embodiment optimized for each application requirement.

Figure 4:
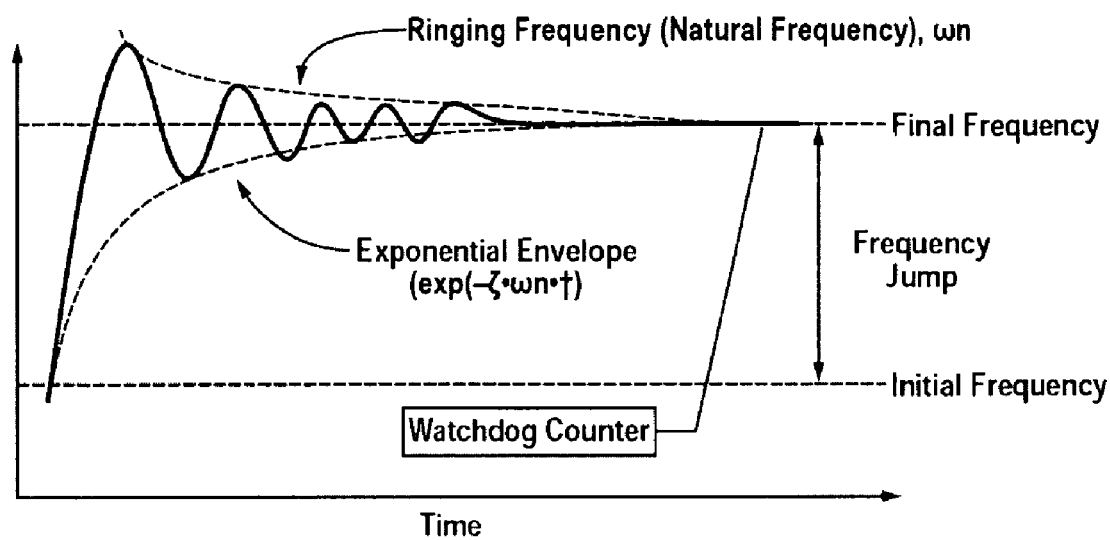
FIG. 4 is a frequency voltage plot showing a watchdog timer indicator in accordance with an embodiment of the present invention.

FIG. 4 illustrates the output of the PLL over time in response to a change in the input clock signal. The watchdog timer is configured to give enough time for the PLL to lock into the new frequency. If the digital lock detector detects that there is a wide variation between the reference clock on its input and the feedback clock it indicates unlock condition, this makes the FSM restart the lock detect procedure and the watchdog counter. By way of illustration, if the frequency range is 100 MHz, the watchdog timer is preferably an integer number times the period which in this instance is 10 µs.

Figure 5:
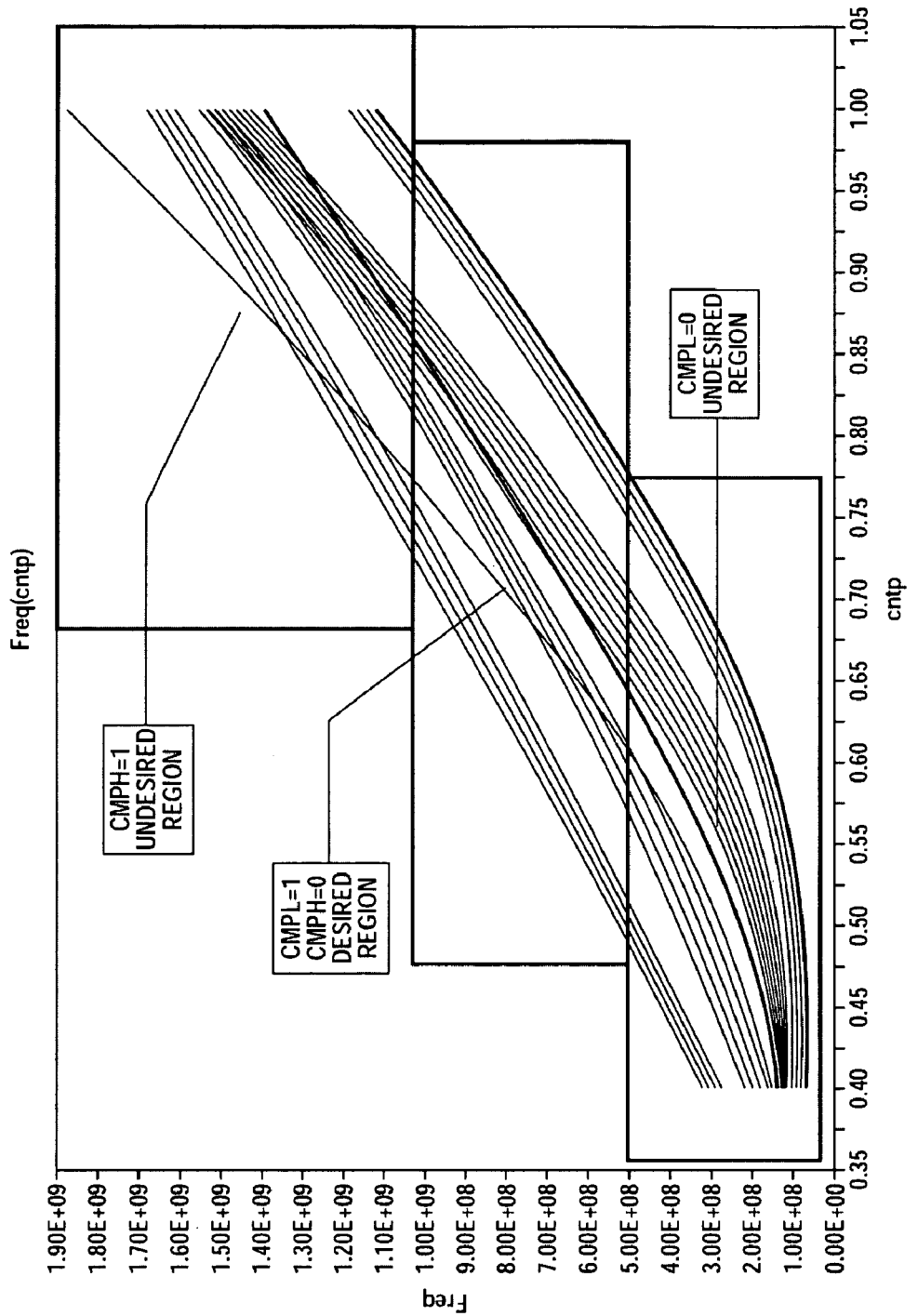
FIG. 5 is a plot of the VCO output in accordance with an embodiment of the present invention.

FIG. 5 illustrates the output of a VCO over all process and voltage ranges. With prior art VCOs, calibration is required to compensate for the process variation for each voltage frequency combination in order to make VCO linear in all it's extent, so that we are able to produce a stable PLL over all corner process. However this process is complex and non trivial. Embodiments of the current invention avoid the need for calibration by employing an algorithm to select the linear portion of the VCO in its middle operating region, avoiding in this way the lower nonlinear effects.

Figure 6:
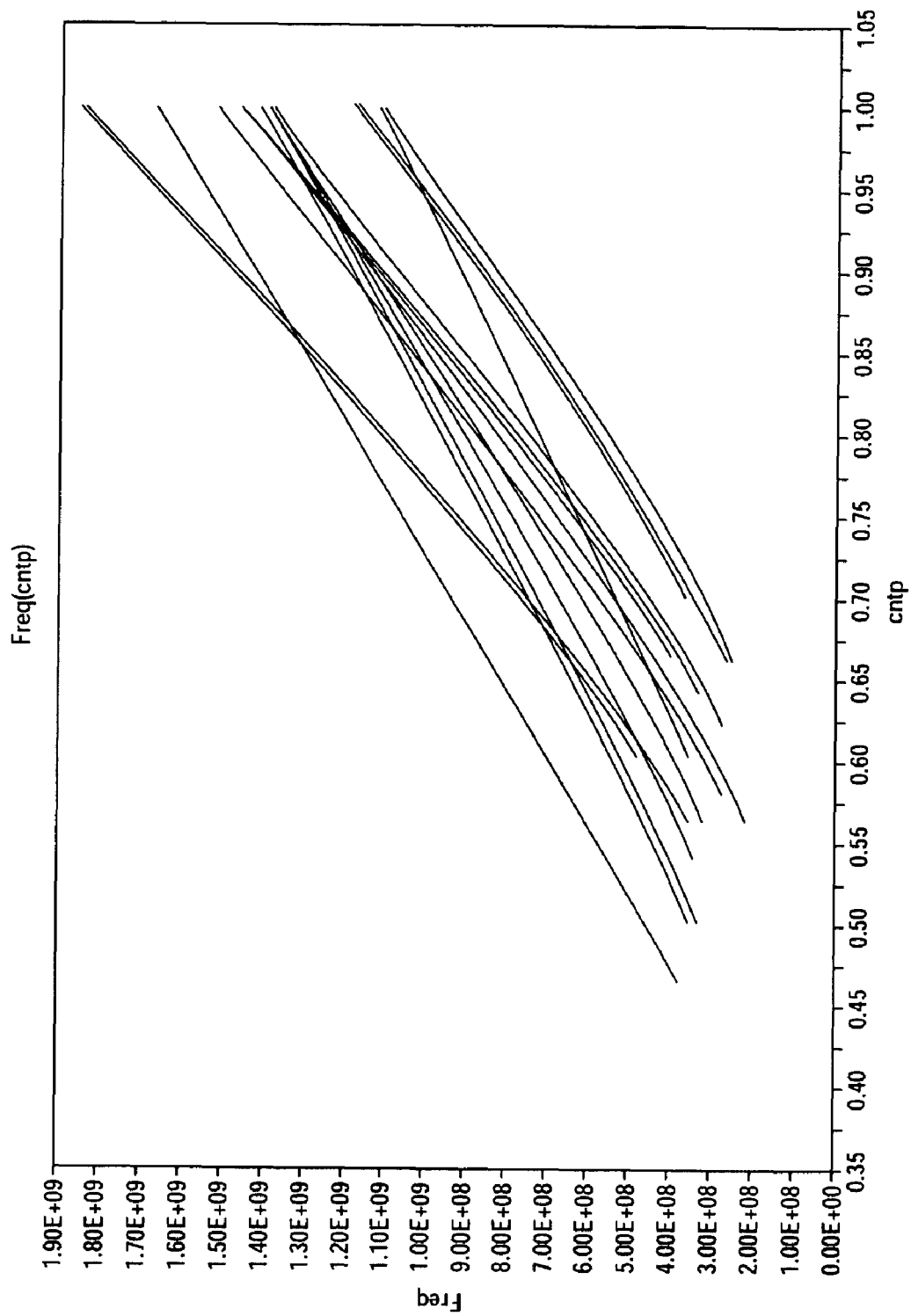
FIG. 6 is a plot of the restricted curve of the VCO output in accordance with an embodiment of the present invention.

Advantageously, the embodiments of the present invention automatically select the linear portion of each process curve as illustrated in FIG. 6. A first reference voltage, CMPL, represents, for a selected process, input clock signal and operating voltage, the lower boundary of a linear operating region of the VCO. A second reference voltage, CMPH, represents the upper boundary of the linear operating region of the VCO. It will be observed that the linear operating range based on process corners (current, voltage, register variation etc) results in an output having constant slope and controlled gain.

Table 2 illustrates representative operating modes and the expected auto range behavior for certain selected frequencies.

TABLE 2

| CLKIN | CP_FREQ | VCO | N | M | Prescaler | EXPECTED_FREQ | OUPTPUT_DIV |
|---|---|---|---|---|---|---|---|
| 2.25E+07 | 2.25E+07 | 6.30E+08 | 7 | 1 | 4 | 1.58E+08 | 4 |
| 3.75E+07 | 3.75E+07 | 1.05E+09 | 7 | 1 | 4 | 2.63E+08 | 4 |
| 4.00E+07 | 2.00E+07 | 5.60E+08 | 7 | 2 | 4 | 2.80E+08 | 2 |
| 7.75E+07 | 3.88E+07 | 1.09E+09 | 7 | 2 | 4 | 5.43E+08 | 2 |
| 8.00E+07 | 2.00E+07 | 5.60E+08 | 7 | 4 | 4 | 5.60E+08 | 1 |

Additionally, the PLL also supports reconfigurability to implement various standards as illustrated in Table 3. In order to be able to implement such support, flexibility was added in the loop as indicated by the VCO offset reconfigurability (see test<2> pin in FIG. 1B).

TABLE 3

| Application | Input Range or $F_{in}$ [Mhz] | Pre Divider | PFD Input Frequency [Mhz] | Fbk Divider | VCO Offset | VCO Output [Mhz] | Notes |
|---|---|---|---|---|---|---|---|
| LVDS | 20 ... 40 | 1 | 20 ... 40 | 28 | High | Fin/Pre* Fbk | R1 = 8K C1 = 52.8 pF C2 = 5.28 pF Icp = 20 uA BW = 2 MHz |
|  | 40 ... 80 | 2 | 20 ... 40 |  |  |  |  |
|  | 80 ... 160 | 4 | 20 ... 40 |  |  |  |  |

TABLE 3-continued

| Application | Input Range or $F_{in}$ [Mhz] | Pre Divider | PFD Input Frequency [Mhz] | Fbk Divider | VCO Offset | VCO Output [Mhz] | Notes |
|---|---|---|---|---|---|---|---|
| USB | 12 | 1 | 12 | 40 | Low | 480 | R1 = 16K C1 = 52.8 pF C2 = 5.28 pF Icp = 7.5 uA BW = 1 MHz |
| | 24 | 1 | 24 | 20 | | | R1 = 8K C1 = 52.8 pF C2 = 5.28 pF Icp = 15 uA BW = 2 MHz |
| | 48 | 2 | 24 | 20 | | | |
| HDMI | 25 ... 40 | 1 | 25 ... 40 | 20 | Low | Fin/Pre* Fbk | R1 = 8K C1 = 52.8 pF C2 = 5.28 pF Icp = 15 uA BW = 2 MHz |
| | 40 ... 80 | 2 | 20 ... 40 | | | | |
| | 80 ... 165 | 4 | 20 ... 41.25 | | | | |
| SATA | 10 | 1 | 10 | 75 | High | 750 | R1 = 16K C1 = 52.8 pF C2 = 5.28 pF Icp = 13.75 uA BW = 1 MHz |
| | 20 | 2 | 10 | | | | R1 = 16K C1 = 52.8 pF C2 = 5.28 pF Icp = 13.75 uA BW = 1 MHz |
| | 25 | 1 | 25 | 30 | | | R1 = 8K C1 = 52.8 pF C2 = 5.28 pF Icp = 21.5 uA BW = 2 MHz |
| | 30 | | 30 | 25 | | | R1 = 8K C1 = 52.8 pF C2 = 5.28 pF Icp = 17.5 uA BW = 2 MHz |
| DigRF | 19.2 | 2 | 9.6 | 65 | High | 624 | R1 = 16K C1 = 52.8 pF C2 = 5.28 pF Icp = 11.25 uA BW = 1 MHz |
| | 26 | 1 | 26 | 24 | | | R1 = 8K C1 = 52.8 pF C2 = 5.28 pF Icp = 17.5 uA BW = 2 MHz |
| | | 2 | 13 | 48 | | | R1 = 8K C1 = 52.8 pF C2 = 5.28 pF Icp = 35 uA BW = 2 MHz |
| | 38.4 | 4 | 9.6 | 65 | | | R1 = 16K C1 = 52.8 pF C2 = 5.28 pF Icp = 11.25 uA BW = 1 MHz |

Advantageously, varying the input current of charge pump 12 provides loop compensation that enables implementation of the multiple applications. The charge pump input current programming can be located on charge pump 12 or on the bias generator (not shown) for the charge pump. By way of illustration with reference to FIG. 1B, the charge pump input current variation for loop compensation is shown in Table 4.

TABLE 4

| CPibias | Comments |
|---|---|
| 20 uA | LVDS_div28 (default) |
| 22.5 uA | SATA_div30 |
| 15 uA | USB_div20/HDMI_div20/SATA_div75 |
| 17.5 uA | SATA_div25/DigRF_div24 |
| 10 uA | DigRF_div65 |
| 12.5 uA | SATA_div75/DigRF_div65 |
| 7.5 uA | USB_div40 |
| 35 uA | DigRF_div48 |

Figure 7:
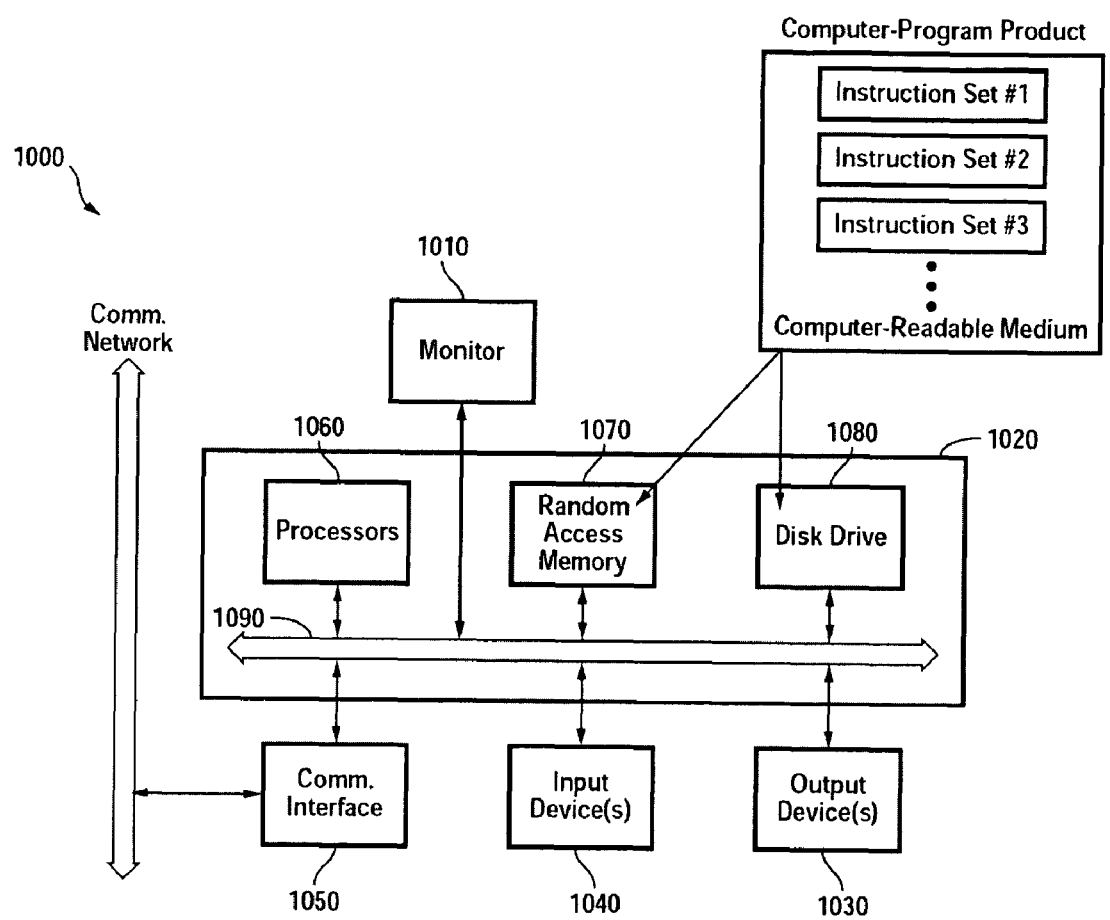
FIG. 7 is a simplified block diagram of a computer system that may incorporate embodiments of the present inventions.

The above method and system embodiments may be implemented by computer-program products that direct a computer system to perform the actions of the methods and functions of the system. Each such computer-program product may comprise sets of instructions embodied on a computer-readable medium that directs the processor of a computer system to perform corresponding actions, including the creation of various data structures and/or self-writing code. FIG. 7 shows a simplified block diagram of a computer system 1000 that may incorporate embodiments of the present invention. FIG. 7 is merely illustrative of an embodiment incorporating the present invention and does not limit the scope of the invention as recited in the claims. One of ordinary skill in the art would recognize other variations, modifications, and alternatives. In one embodiment, computer system 1000 typically includes a monitor 1010, a computer 1020, user output devices 1030, user input devices 1040, communications interface 1050, and the like.

As shown in FIG. 7, computer 1020 may include one or more processors 1060 that communicate with a number of peripheral devices via a bus subsystem 1090. These peripheral devices may include user output devices 1030, user input devices 1040, communications interface 1050, and a storage subsystem, such as random access memory (RAM) 1070 and disk drive 1080.

User input devices 1040 include all possible types of devices and mechanisms for inputting information to computer system 1020. These may include a keyboard, a keypad, a touch screen incorporated into the display, and other types of input devices. In various embodiments, user input devices 1040 are typically embodied as a computer mouse, a trackball, a track pad, a joystick, a wireless remote, a drawing tablet, and the like. User input devices 1040 typically allow a user to select objects, icons, text and the like that appear on the monitor 1010 via a command such as a click of a button or the like.

User output devices 1030 include all possible types of devices and mechanisms for outputting information from computer 1020. These may include a display (e.g., monitor 1010), non-visual displays such as audio output devices, etc.

Communications interface 1050 provides an interface to other communication networks and devices. Communications interface 1050 may serve as an interface for receiving data from and transmitting data to other systems. Embodiments of communications interface 1050 typically include an Ethernet card, a modem (telephone, satellite, cable, ISDN), (asynchronous) digital subscriber line (DSL) unit, FireWire interface, USB interface, and the like. For example, communications interface 1050 may be coupled to a computer network, to a FireWire bus, or the like. In other embodiments, communications interface 1050 may be physically integrated on the motherboard of computer 1020, and may be a software program, such as soft DSL, or the like.

In various embodiments, computer system 1000 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiments, computer 1020 includes one or more Xeon microprocessors from Intel as processor(s) 1060. Further, in one embodiment, computer 1020 includes a UNIX-based operating system, such as Linux.

RAM 1070 and disk drive 1080 are examples of tangible computer-readable media configured to store data such as computer-program product embodiments of the present invention, including executable computer code, human-readable code, or the like. Other types of tangible computer-readable media include floppy disks, removable hard disks, optical storage media such as CD-ROMs, DVDs and bar codes, semiconductor memories such as flash memories, read-only-memories (ROMs), battery-backed volatile memories, networked storage devices, and the like. RAM 1070 and disk drive 1080 may be configured to store the basic programming and data constructs that provide the functionality of various embodiments of the present invention.

Software code modules and instructions that provide the functionality of the present invention may be stored in RAM 1070 and disk drive 1080. These software modules and instructions may be executed by processor(s) 1060. RAM 1070 and disk drive 1080 may also provide a repository for storing data used in accordance with the present invention.

RAM 1070 and disk drive 1080 may include a number of memories including a main random access memory (RAM) for storage of instructions and data during program execution and a read-only memory (ROM) in which fixed instructions are stored. RAM 1070 and disk drive 1080 may include a file storage subsystem providing persistent (non-volatile) storage for program and data files. RAM 1070 and disk drive 1080 may also include removable storage systems, such as removable flash memory.

Bus subsystem 1090 provides a mechanism for letting the various components and subsystems of computer 1020 communicate with each other as intended. Although bus subsystem 1090 is shown schematically as a single bus, alternative embodiments of the bus subsystem may utilize multiple busses.

FIG. 7 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors is contemplated, such as Pentium™ or Itanium™ microprocessors from Intel Corporation; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board having an embedded microprocessor such as is available from MIPS Technologies, Inc.

The specification and drawings are, accordingly, to be regarded in an illustrative rather than a restrictive sense. It will be evident that various modifications and changes may be made thereunto without departing from the broader spirit and scope of the inventions as set forth in the claims. In addition, the techniques, methods, computer-program products, and systems of the present invention are suitable for use with a wide variety of EDA tools and methodologies for checking, verifying, editing, revising, and fixing circuit layouts. The scope of the invention should, therefore, be determined not with reference to the above description, but instead should be determined with reference to the pending claims along with their full scope or equivalents.

What is claimed is:

1. A phase locked loop circuit comprising:
    an analog portion adapted to generate a voltage controlled oscillator frequency of a voltage controlled oscillator responsive to a wide range of input frequencies; and
    a digital portion adapted to selectively over-sample, or not, the voltage controlled oscillator frequency so that the voltage controlled oscillator remains in its linear operating region for a plurality of input frequencies, the digital portion further adapted to wait a number of feedback cycles to allow a loop of the phase locked loop circuit to stabilize.

2. The phase locked loop circuit of claim 1 wherein the digital portion selectively scales a reference clock to automatically maintain the voltage controlled oscillator in its linear operating region.

3. The phase locked loop circuit of claim 2 wherein the analog portion comprises:
    a phase frequency detector (PFD) having its input coupled to the digital portion;
    a charge pump having its input coupled to an output of the PFD; and
    a low pass filter having its input coupled to the output of the charge pump and its output coupled to the voltage controlled oscillator and to a pair of threshold comparators.

4. The phase locked loop circuit of claim 3 wherein the pair of threshold comparators comprises a first comparator that indicates a lower frequency operating state to a finite state machine and a second comparator that represents the higher frequency operating state to the finite state machine.

5. The phase locked loop circuit of claim 4 wherein the first comparator indicates to the finite state machine if VCO control voltage (cntp) is in its linear operating region.

6. The phase locked loop circuit of claim 4 wherein the second comparator indicates to the finite state machine if VCO control voltage (cntp) is in its linear operating region.

7. The phase locked loop circuit of claim 4 wherein the first and second comparators track process parameters of the voltage controlled oscillator to effectively produce a voltage that corresponds to a required range over all a plurality of process corners.

8. A method of operating a PLL circuit, the method comprising:
    receiving a clock signal complying with a selected specification; and
    operating a finite state machine, in response to outputs of a pair of analog comparators, a digital lock detector, and a watchdog timer, to selectively change a clock divider to maintain a VCO in a stable operating region,
    wherein operating the finite state machine includes selectively over-sampling a VCO frequency and waiting a number of feedback cycles to allow a loop of the PLL circuit to stabilize.

9. The method of claim 8 wherein the clock divider is an input clock divider.

10. The method of claim 8 wherein the clock divider is a loop clock divider.

11. The method of claim 8 wherein the watchdog timer determines if the VCO has timely achieved a desired frequency.

12. The method of claim 8 wherein the digital lock detector indicates whether the VCO is locked.

13. The method of claim 12 wherein a the finite state machine restarts an auto-range algorithm if the VCO is not timely locked based on a watchdog, lock detector and comparators status.

* * * * *

UNITED STATES PATENT AND TRADEMARK OFFICE
CERTIFICATE OF CORRECTION

PATENT NO.       : 7,940,128 B2
APPLICATION NO.  : 12/211786
DATED            : May 10, 2011
INVENTOR(S)      : Joaquim J. Machado Page 1 of 1

It is certified that error appears in the above-identified patent and that said Letters Patent is hereby corrected as shown below:

Column 10
Line 22, amend "the" to -- an --.
Line 28, amend "the" to -- a --.
Line 39, delete "all".
Line 62, delete "a".

Signed and Sealed this
Twentieth Day of March, 2012

David J. Kappos
*Director of the United States Patent and Trademark Office*